(12) United States Patent
Komura (10) Patent No.: US 10,193,529 B2
(45) Date of Patent: Jan. 29, 2019

(54) ELASTIC WAVE DEVICE

(71) Applicant: Murata Manufacturing Co., Ltd., Nagaokakyo-shi, Kyoto-fu (JP)

(72) Inventor: Tomohisa Komura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1 day.

(21) Appl. No.: 15/486,341

(22) Filed: Apr. 13, 2017

(65) Prior Publication Data

US 2017/0310305 A1    Oct. 26, 2017

(30) Foreign Application Priority Data

Apr. 25, 2016 (JP) ................... 2016-087544

(51) Int. Cl.
    *H03H 9/64* (2006.01)
    *H03H 9/02* (2006.01)
    (Continued)

(52) U.S. Cl.
    CPC ........... *H03H 9/64* (2013.01); *H01L 41/0472* (2013.01); *H01L 41/083* (2013.01);
    (Continued)

(58) Field of Classification Search
    CPC .................. H03H 9/64; H01L 41/083
    (Continued)

(56) References Cited

U.S. PATENT DOCUMENTS

| 6,593,678 | B1* | 7/2003 | Flowers ............... H03H 9/0542 |
| | | | 310/313 R |
| 6,903,631 | B2* | 6/2005 | Kushitani ............ H03H 9/0542 |
| | | | 310/313 B |

(Continued)

FOREIGN PATENT DOCUMENTS

JP    2000-312125 A    11/2000
JP    2011-044765 A    3/2011

(Continued)

OTHER PUBLICATIONS

Official Communication issued in Korean Patent Application No. 10-2017-0051135, dated Mar. 21, 2018.

(Continued)

*Primary Examiner* — Dean Takaoka
(74) *Attorney, Agent, or Firm* — Keating & Bennett, LLP (57) ABSTRACT

A surface acoustic wave filter includes first and second signal terminals and first and second IDT electrodes that are adjacent to or in a vicinity of each other in an x-axis direction and that each includes a pair of comb-shaped electrodes each including a busbar electrode extending in the x-axis direction and electrode fingers extending in a y-axis direction. One of the comb-shaped electrodes in each of the first and second IDT electrodes is electrically connected to the first and second signal terminals, respectively. The surface acoustic wave filter further includes a bridging capacitance including a pair of comb-shaped electrodes arranged in a region outside an overlap region of the electrode fingers. One of the comb-shaped electrodes of the (Continued)

bridging capacitance is electrically connected to the comb-shaped electrode in the first IDT electrode. The other of the comb-shaped electrodes of the bridging capacitance is electrically connected to the comb-shaped electrode in the second IDT electrode.

20 Claims, 9 Drawing Sheets

(51) Int. Cl.
*H01L 41/047* (2006.01)
*H01L 41/083* (2006.01)
*H01L 41/107* (2006.01)
*H03H 9/00* (2006.01)

(52) U.S. Cl.
CPC ......... *H01L 41/107* (2013.01); *H03H 9/0038* (2013.01); *H03H 9/02992* (2013.01); *H03H 9/6436* (2013.01)

(58) Field of Classification Search
USPC ........... 333/133, 193–196; 310/313 B, 313 R
See application file for complete search history.

(56) References Cited

U.S. PATENT DOCUMENTS

| | | | | |
|---|---|---|---|---|
| 7,242,271 B2* | 7/2007 | Komazaki | ............ | H03H 9/6483 333/193 |
| 7,394,336 B2* | 7/2008 | Kando | ................. | H03H 9/0071 310/313 B |
| 7,915,975 B2* | 3/2011 | Bauer | ................. | H03H 9/0028 333/193 |
| 8,427,259 B2* | 4/2013 | Fujiwara | .............. | H03H 9/0071 310/313 B |
| 8,531,255 B2* | 9/2013 | Loseu | ...................... | H03H 9/64 310/313 D |
| 8,710,940 B2* | 4/2014 | Sogoya | ................ | H03H 9/6483 310/313 B |
| 2009/0201103 A1* | 8/2009 | Watanabe | ............ | H03H 9/6476 333/193 |
| 2011/0006855 A1 | 1/2011 | Fujiwara et al. | | |
| 2013/0187725 A1* | 7/2013 | Ikeuchi | ................ | H03H 9/0057 333/5 |

FOREIGN PATENT DOCUMENTS

| | | |
|---|---|---|
| JP | 2015-041909 A | 3/2015 |
| KR | 10-2010-0130602 A | 12/2010 |
| WO | 2012/160730 A1 | 11/2012 |

OTHER PUBLICATIONS

Official Communication issued in Japanese Patent Application No. 2016-087544, dated Aug. 21, 2018.

* cited by examiner

ELASTIC WAVE DEVICE

CROSS REFERENCE TO RELATED APPLICATIONS

This application claims the benefit of priority to Japanese Patent Application No. 2016-087544 filed on Apr. 25, 2016. The entire contents of this application are hereby incorporated herein by reference.

BACKGROUND OF THE INVENTION

1. Field of the Invention

The present invention relates to an elastic wave device.

2. Description of the Related Art

Elastic wave filter devices, such as longitudinally coupled resonator surface acoustic wave (SAW) filters and ladder-type SAW filters, have been used in communication equipment, such as cellular phones. With the progress of multi-band operation of communication equipment in recent years, the elastic wave filter devices are coming under increasing pressure to reduce the insertion loss in a communication band and also to improve the attenuation outside the communication band.

Figure 9:
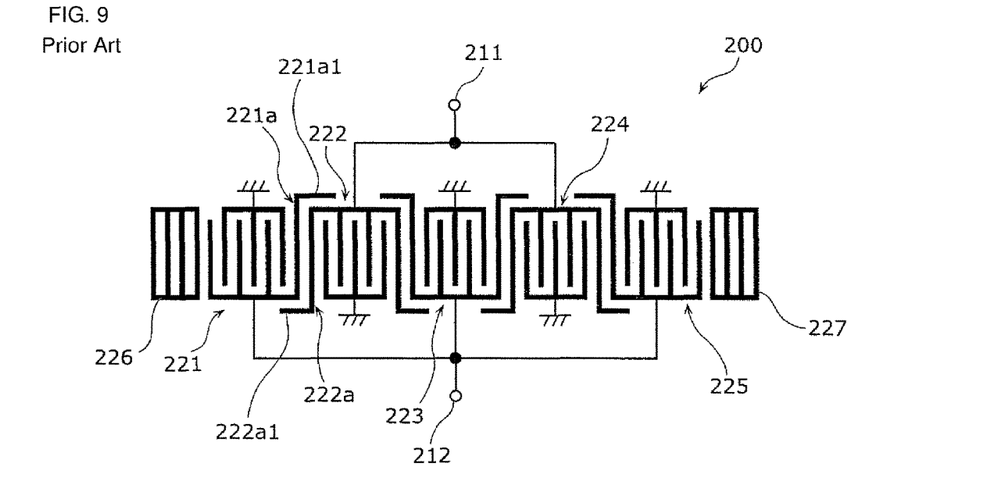
FIG. 9 is a plan view that illustrates an electrode configuration of an elastic wave device described in International Publication No. 2012-160730.

FIG. 9 is a plan view that illustrates an electrode configuration of an elastic wave device 200 described in International Publication No. 2012/160730. The elastic wave device 200 illustrated in FIG. 9 is an elastic wave filter of the longitudinally coupled resonator and includes interdigital transducer (IDT) electrodes 221 to 225 adjacent in a direction of propagation of elastic waves and reflectors 226 and 227. The IDT electrodes 222 and 224 are connected to a first signal terminal 211, and the IDT electrodes 221, 223, and 225 are connected to a second signal terminal 212. The IDT electrode 221 includes an electrode finger 221a nearest the IDT electrode 222. The electrode finger 221a includes an electrode finger 221a1 opposed to the IDT electrode 222 in a direction substantially perpendicular to the direction of propagation of elastic waves. The IDT electrode 222 includes an electrode finger 222a nearest the IDT electrode 221. The electrode finger 222a includes an electrode finger 222a1 opposed to the IDT electrode 221 in the direction substantially perpendicular to the direction of propagation of elastic waves. The other IDT electrodes 223 to 225 have substantially the same structure as described above. That is, each of the IDT electrodes 221 to 225 forms a bridging capacitance between the extended portion in the IDT electrode finger and a busbar electrode in the adjacent resonator. This aims to improve the attenuation of harmonics in the longitudinally coupled resonator elastic wave filter.

However, the elastic wave device 200 in International Publication No. 2012-160730 has a problem that sufficient thermal dissipation is not obtainable because the electrode area in the IDT electrodes including the bridging capacitances is insufficient. For example, when the longitudinally coupled resonator elastic wave filter is used as a reception filter, insufficient thermal dissipation results in degraded electric power handling capability. Thus, if some transmission signals that should reach an antenna terminal through a transmission filter arrive at the reception filter as leakage power, this may lead to a decrease in the detection sensitivity to reception signals or breakage of the filter.

SUMMARY OF THE INVENTION

Preferred embodiments of the present invention provide elastic wave devices with filter characteristics in which thermal dissipation is significantly improved and an attenuation characteristic outside a pass band is significantly improved or optimized.

According to a preferred embodiment of the present invention, an elastic wave device includes a first signal terminal, a second signal terminal, a first IDT electrode and a second IDT electrode that are adjacent to or in a vicinity of each other in or substantially in a direction of propagation of elastic waves, and at least one bridging capacitance. Each of the first IDT electrode and the second IDT electrode includes a pair of comb-shaped electrodes. Each of the comb-shaped electrodes includes a busbar electrode extending in or substantially in the direction of propagation of elastic waves and a plurality of electrode fingers connected to the busbar electrode and extending in or substantially in a direction that crosses the direction of propagation of elastic waves. One of the pair of comb-shaped electrodes in the first IDT electrode is a first comb-shaped electrode electrically connected to the first signal terminal. One of the pair of comb-shaped electrodes in the second IDT electrode is a second comb-shaped electrode electrically connected to the second signal terminal. The bridging capacitance is arranged in a region outside a region sandwiched between the electrode fingers that are adjacent to or in a vicinity of each other in or substantially in the direction of propagation of elastic waves and includes a pair of comb-shaped electrodes opposed to each other at a predetermined interval. One of the pair of comb-shaped electrodes in the bridging capacitance is a first comb-shaped electrode electrically connected to the first comb-shaped electrode, and the other of the pair of comb-shaped electrodes is a second comb-shaped electrode electrically connected to either one of the pair of comb-shaped electrodes in the second IDT electrode.

Thus, because the bridging capacitance electrically connected to the first IDT electrode and second IDT electrode is arranged without changing the layout in the overlap region of the electrode fingers in the IDT electrodes, which define the elastic-wave propagation characteristic, the out-of-band attenuation characteristic is able to be significantly improved without degrading the in-band bandpass characteristic of the elastic wave device. With the addition of the bridging capacitance including the comb-shaped electrodes, the areas of all of the electrodes are able to be increased, and the thermal dissipation and pyroelectricity resistance (ESD resistance) are able to be significantly improved.

The first comb-shaped electrode in the bridging capacitance may be electrically connected to the busbar electrode in the first comb-shaped electrode. The second comb-shaped electrode in the bridging capacitance may be electrically connected to the electrode finger that is closest to the first IDT electrode among the plurality of electrode fingers in the second comb-shaped electrode.

Thus, because the bridging capacitance is electrically connected between the input and output terminals, by adjusting the number of electrode fingers in the pair of comb-shaped electrodes included in the bridging capacitance and the interval between the electrode fingers and the like, the attenuation pole on the out-of-band high-frequency side is able to be flexibly moved, and this facilitates significant improvement or optimization of the attenuation characteristic. Accordingly, the attenuation characteristic on the out-of-band high-frequency side is able to be significantly improved without degrading the in-band bandpass characteristic.

An elastic wave device according to a preferred embodiment of the present invention may be a longitudinally coupled resonator surface acoustic wave filter, for example.

In a longitudinally coupled resonator surface acoustic wave filter according to a comparative example, it is difficult to provide a sufficient attenuation on the out-of-band high-frequency side. In contrast, the above-described bridging capacitance provides flexible movement of the attenuation pole on the out-of-band high-frequency side, and this provides a significant improvement or optimization of the attenuation characteristic on the out-of-band high-frequency side. Accordingly, the configuration described above may be suited, in particular, for the longitudinally coupled resonator surface acoustic wave filter.

The at least one bridging capacitance may include a plurality of bridging capacitances.

Thus, the plurality of bridging capacitances is arranged in parallel between the first IDT electrode and second IDT electrode. This configuration is able to further improve the conductance component (reduce the resistive component) while maintaining the capacitance component, in comparison with the configuration in which one bridging capacitance is arranged between the first IDT electrode and second IDT electrode. Accordingly, the Q value of the resonators including the IDT electrodes is able to be significantly improved, and the in-band insertion loss is able to be significantly reduced.

In an elastic wave device according to a preferred embodiment of the present invention, for example, the plurality of bridging capacitances may include a first bridging capacitance and a second bridging capacitance that are opposed to each other with the first IDT electrode and the second IDT electrode disposed therebetween. One of the pair of comb-shaped electrodes in the first bridging capacitance may be electrically connected to the busbar electrode in the first comb-shaped electrode. The other of the pair of comb-shaped electrodes in the first bridging capacitance may be electrically connected to the electrode finger that is closest to the first IDT electrode among the plurality of electrode fingers in the second comb-shaped electrode. One of the pair of comb-shaped electrodes in the second bridging capacitance may be electrically connected to the busbar electrode in the second comb-shaped electrode. The other of the pair of comb-shaped electrodes in the second bridging capacitance may be electrically connected to the electrode finger that is closest to the second IDT electrode among the plurality of electrode fingers in the first comb-shaped electrode.

Thus, the plurality of bridging capacitances is arranged in parallel between the first IDT electrode and second IDT electrode and between the input and output terminals. This configuration is able to further improve the conductance component (reduce the resistive component) between the input and output terminals while maintaining the capacitance component, in comparison with the configuration in which one bridging capacitance is arranged between the input and output terminals. Accordingly, the Q value of the resonators including the IDT electrodes is able to be significantly improved, and the in-band insertion loss is able to be significantly reduced. Because the two bridging capacitances are separately arranged to be opposed to each other with the IDT electrodes disposed therebetween, the area of the arrangement of the electrodes is able to be significantly reduced.

Elastic wave devices according to various preferred embodiments of the present invention improve the thermal dissipation and improve or optimize the attenuation characteristic outside the pass band.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention are described in detail below with reference to the drawings. The preferred embodiments described below indicate general or specific examples. The numeric values, shapes, materials, components, and arrangement and topology of the components described in the preferred embodiments below are examples and do not intend to limit the invention. Among the components in the preferred embodiments below, components that are not described in the independent claim are described as being optional. The sizes of the components or the ratio of the sizes shown in the drawings may not be strictly correct. It is to be noted that the preferred embodiments described in this specification are merely examples, and that the configurations in the preferred embodiments are able to be partly replaced or combined between different preferred embodiments as desired.

First Preferred Embodiment

Figure 1:
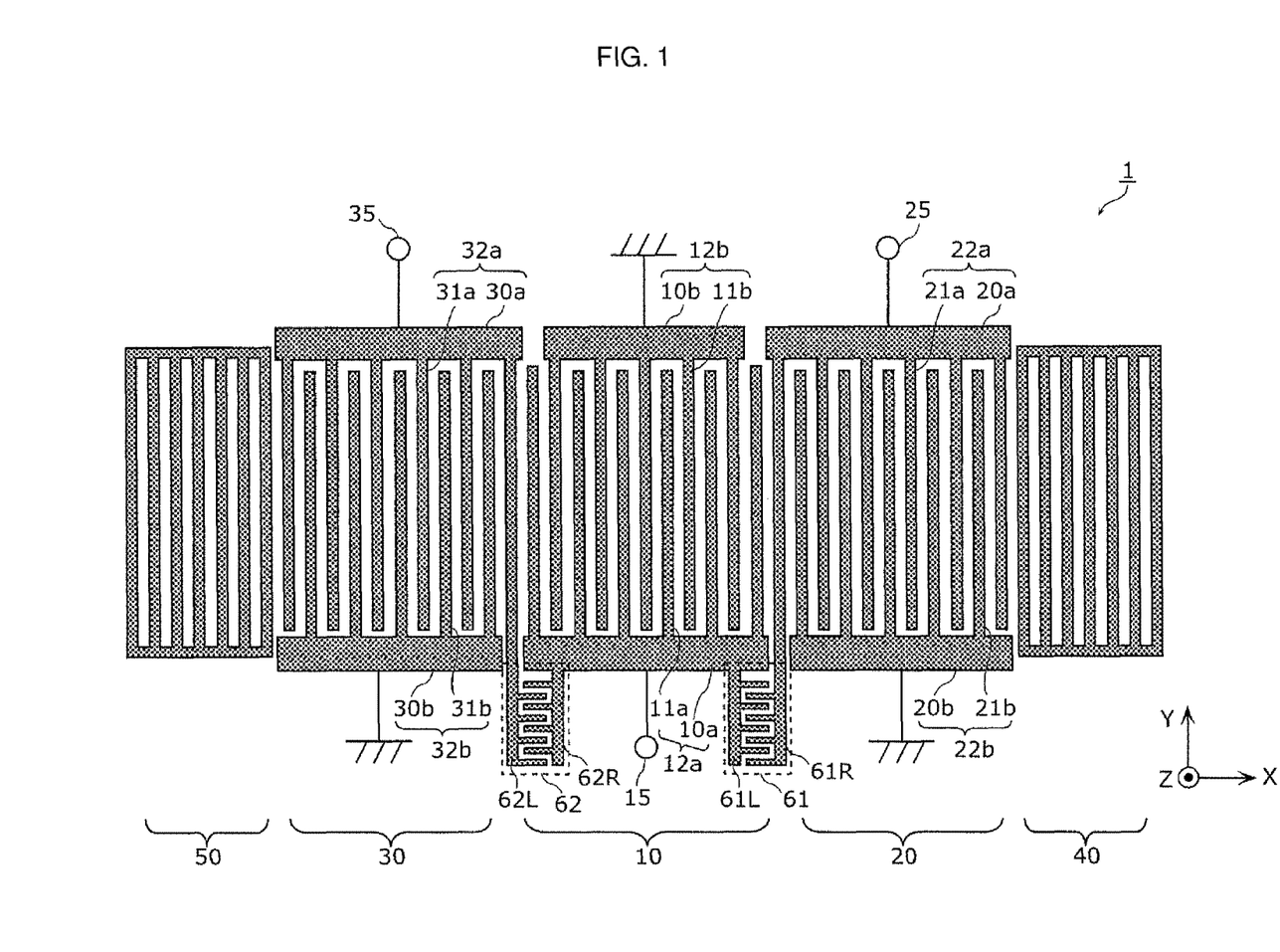
FIG. 1 is a plan view that illustrates an electrode configuration of a surface acoustic wave filter according to a first preferred embodiment of the present invention.

FIG. 1 is a plan view that illustrates an electrode configuration of a surface acoustic wave filter 1 according to a first preferred embodiment of the present invention and illustrates a layout of arrangement of electrodes on a piezoelectric substrate when the piezoelectric substrate is seen in plan view. The surface acoustic wave filter 1 preferably is a longitudinally coupled resonator elastic wave filter and may be included in, for example, a transmission filter or reception filter in a front-end portion of a cellular phone. The longitudinally coupled resonator elastic wave filter is also able to be applied to cases where input and output configurations of a balanced-input (two-input) type, balanced-output (two-output) type, and balanced-input balanced-output (two-input, two-output) type are desired, with respect to the electrode configuration.

As shown in FIG. 1, the surface acoustic wave filter 1 includes interdigital transducer (IDT) electrodes 10, 20, and 30 that are adjacent to or in a vicinity of each other in or substantially in a direction of propagation of elastic waves (x-axis direction); reflectors 40 and 50; signal terminals 15, 25, and 35; and bridging capacitances 61 and 62.

The IDT electrodes 10, 20, and 30 are adjacent to or in a vicinity of each other in or substantially in the direction of propagation of elastic waves (x-axis direction). The reflectors 40 and 50 are adjacent to or in a vicinity of the IDT electrodes 20 and 30, respectively, in or substantially in the direction of propagation of elastic waves (x-axis direction).

The IDT electrode 10 includes comb-shaped electrodes 12a and 12b. The comb-shaped electrode 12a includes a busbar electrode 10a extending in or substantially in the direction of propagation of elastic waves (x-axis direction) and a plurality of electrode fingers 11a connected to the busbar electrode 10a and extending in or substantially in a direction that crosses the direction of propagation of elastic waves (y-axis direction). The comb-shaped electrode 12b includes a busbar electrode 10b extending in or substantially in the direction of propagation of elastic waves (x-axis direction) and a plurality of electrode fingers 11b connected to the busbar electrode 10b and extending in or substantially in the direction crossing the direction of propagation of elastic waves (y-axis direction). The comb-shaped electrodes 12a and 12b define a pair of comb-shaped electrodes that interlock with each other and are opposed to each other at predetermined intervals.

The IDT electrode 20 includes comb-shaped electrodes 22a and 22b. The comb-shaped electrode 22a includes a busbar electrode 20a extending in or substantially in the direction of propagation of elastic waves (x-axis direction) and a plurality of electrode fingers 21a connected to the busbar electrode 20a and extending in or substantially in the direction that crosses the direction of propagation of elastic waves (y-axis direction). The comb-shaped electrode 22b includes a busbar electrode 20b extending in or substantially in the direction of propagation of elastic waves (x-axis direction) and a plurality of electrode fingers 21b connected to the busbar electrode 20b and extending in or substantially in the direction crossing the direction of propagation of elastic waves (y-axis direction). The comb-shaped electrodes 22a and 22b define a pair of comb-shaped electrodes that interlock with each other and are opposed to each other at predetermined intervals.

The IDT electrode 30 includes comb-shaped electrodes 32a and 32b. The comb-shaped electrode 32a includes a busbar electrode 30a extending in or substantially in the direction of propagation of elastic waves (x-axis direction) and a plurality of electrode fingers 31a connected to the busbar electrode 30a and extending in or substantially in the direction that crosses the direction of propagation of elastic waves (y-axis direction). The comb-shaped electrode 32b includes a busbar electrode 30b extending in or substantially in the direction of propagation of elastic waves (x-axis direction) and a plurality of electrode fingers 31b connected to the busbar electrode 30b and extending in or substantially in the direction crossing the direction of propagation of elastic waves (y-axis direction). The comb-shaped electrodes 32a and 32b define a pair of comb-shaped electrodes that interlock with each other and are opposed to each other at predetermined intervals.

The comb-shaped electrode 12a (e.g., a first comb-shaped electrode) in the IDT electrode 10 (e.g., a first IDT electrode) is electrically connected to the signal terminal 15 (e.g., a first signal terminal). The comb-shaped electrode 12b in the IDT electrode 10 is electrically connected to a ground terminal. The comb-shaped electrode 22a (e.g., a second comb-shaped electrode) in the IDT electrode 20 (e.g., a second IDT electrode) is electrically connected to the signal terminal 25 (e.g., a second signal terminal). The comb-shaped electrode 32a in the IDT electrode 30 is electrically connected to the signal terminal 35. The comb-shaped electrode 22b in the IDT electrode 20 and the comb-shaped electrode 32b in the IDT electrode 30 are electrically connected to ground terminals.

In the above-described configuration, during operation of the surface acoustic wave filter 1, the signal terminal 15 defines and functions as a high-frequency input terminal and the signal terminals 25 and 35 define and function as high-frequency output terminals. Thus, the surface acoustic wave filter 1 is able to have filter characteristics of an unbalanced-input (one-input)-unbalanced-output (one-output) type in which the filter allows high-frequency signals within a predetermined frequency range to pass therethrough with low losses and attenuates high-frequency signals outside the predetermined frequency range.

However, during operation of the surface acoustic wave filter 1, the signal terminals 25 and 35 may define and function as high-frequency input terminals and the signal terminal 15 may define and function as a high-frequency output terminal, for example.

The surface acoustic wave filter 1 may include a balanced-input configuration with the comb-shaped electrodes 12a and 12b by operating the comb-shaped electrode 12b in the IDT electrode 10 as a high-frequency input terminal without electrically connecting it to the ground terminal, for example. Further, the surface acoustic wave filter 1 may include a balanced-output configuration with the comb-shaped electrodes 22a and 22b and the comb-shaped electrodes 32a and 32b by operating the comb-shaped electrode 22b in the IDT electrode 20 and the comb-shaped electrode 32b in the IDT electrode 30 as high-frequency input terminals without electrically connecting them to the ground terminals, for example.

The bridging capacitances 61 and 62 are described below with respect to the configuration of the bridging capacitances.

Next, an example of the structure of a surface acoustic wave resonator included in the surface acoustic wave filter 1 is described.

Figure 2:
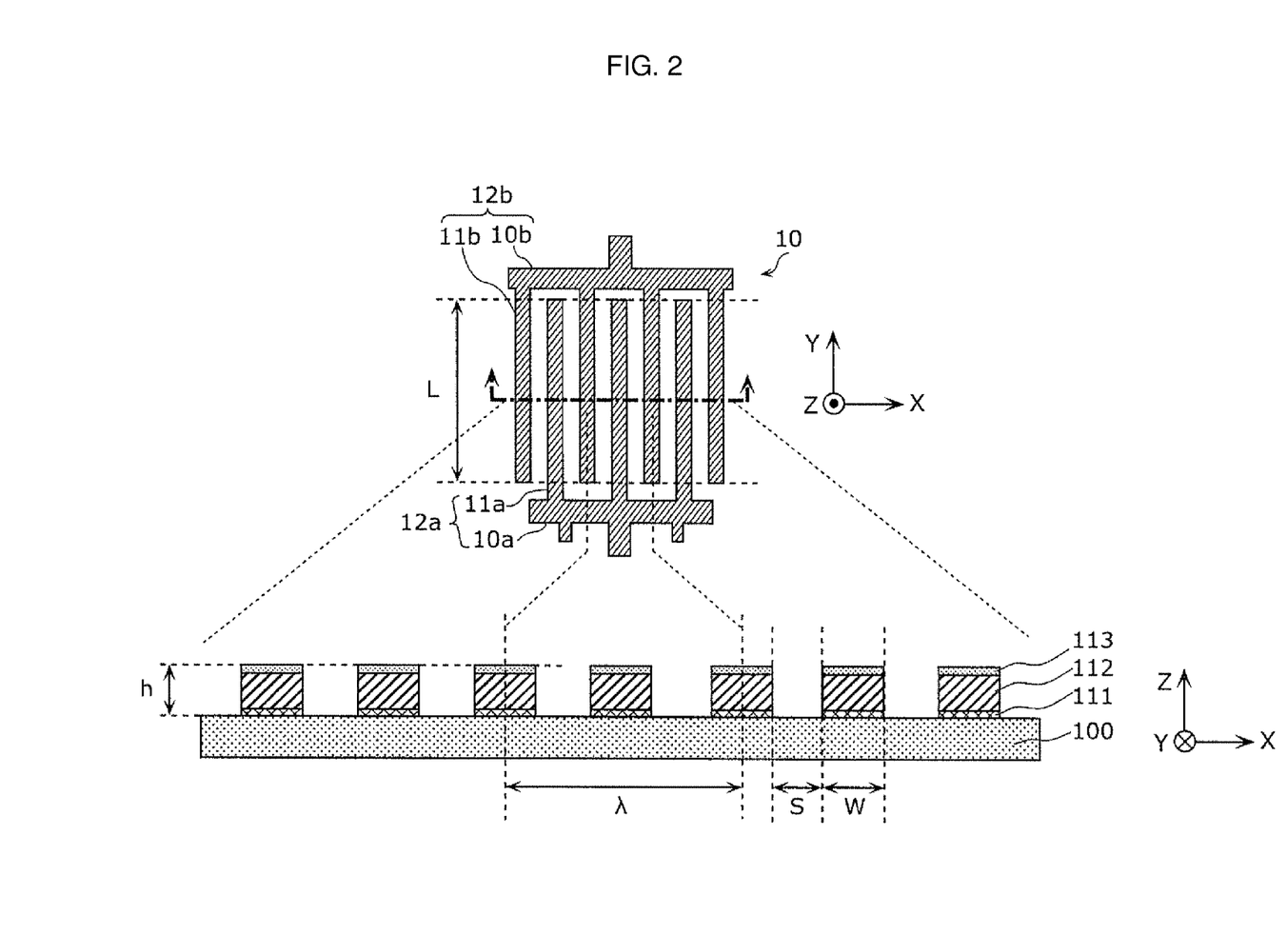
FIG. 2 includes a plan view and a cross-sectional view that schematically illustrate a resonator in the surface acoustic wave filter according to the first preferred embodiment of the present invention.

FIG. 2 includes a plan view and a cross-sectional view that schematically illustrate a resonator in the surface acoustic wave filter 1 according to the first preferred embodiment. FIG. 2 illustrates an example schematic plan view and an example schematic cross-sectional view of the structure of a resonator including the IDT electrode 10 among a plurality of resonators included in the surface acoustic wave filter 1. The resonator in FIG. 2 shows one example of a structure of the plurality of resonators included in the surface acoustic wave filter 1, and specifications of electrodes, including the number of electrode fingers included in an electrode and the length of an electrode finger, are not limited to the example shown in FIG. 2.

The resonator shown in FIG. 2 includes a piezoelectric substrate 100 and the IDT electrode 10. As shown in the plan view in FIG. 2, the single pair of comb-shaped electrodes 12a and 12b opposed to each other are disposed on the piezoelectric substrate 100. The comb-shaped electrode 12a includes the plurality of electrode fingers 11a extending in parallel or substantially in parallel with each other and the busbar electrode 10a connecting the plurality of electrode fingers 11a. The comb-shaped electrode 12b includes the plurality of electrode fingers 11b extending in parallel or substantially in parallel with each other and the busbar electrode 10b connecting the plurality of electrode fingers 11b.

As shown in the cross-sectional view in FIG. 2, the IDT electrode 10 includes a multilayer structure of a close contact layer 111 and a main electrode layer 112.

The close contact layer 111 is a layer that increases the adhesion between the piezoelectric substrate 100 and main electrode layer 112. One example of a material included in the close contact layer 111 is titanium. One example of a film thickness of the close contact layer 111 is about 12 nm.

One example of a material included in the main electrode layer 112 is aluminum including about 1% copper. One example of a film thickness of the main electrode layer 112 is about 162 nm.

The IDT electrode 10 is covered with a protective layer 113. The protective layer 113 is a layer that is provided to protect the main electrode layer 112 from an external environment, to adjust the frequency temperature characteristic, to enhance the moisture resistance, and the like. One example of the protective layer 113 is a film that includes silicon dioxide as a primary component.

The materials of the close contact layer 111, main electrode layer 112, and protective layer 113 are not limited to the materials includes in the above-described examples. The IDT electrode 10 may include a structure other than the above-described multilayer structure, for example. The IDT electrode 10 may include a metal, for example, titanium, aluminum, copper, platinum, gold, silver, or palladium, or an alloy of any combination these metals. The IDT electrode 10 may also include a plurality of multilayer structures that each includes any of the above-described metals or alloys, for example. The protective layer 113 may be omitted, for example.

The piezoelectric substrate 100 may include, for example, lithium tantalate single crystal cut at a predetermined cut angle or ceramic, to provide propagation of surface acoustic waves in or substantially in a predetermined direction.

Design parameters of the IDT electrodes are described below. The wavelength of the surface acoustic wave resonator is defined as a repetition pitch λ of the plurality of electrode fingers 11a and 11b illustrated in the middle row in FIG. 2. The overlap width L of the IDT electrode is the length of the electrode finger where the electrode fingers 11a and 11b overlap each other, as illustrated in the upper row in FIG. 2. The number of pairs indicates the number of the plurality of electrode fingers 11a or 11b.

The structure of the surface acoustic wave filter 1 according to the first preferred embodiment is not limited to the structure shown in FIG. 2. For example, the IDT electrode 10 may not include a multilayer structure of metal films and may be provided as a single-layer metal film.

Next, the bridging capacitances 61 and 62 according to the first preferred embodiment are described below.

The bridging capacitance 61 is arranged in a region other than the region sandwiched between the electrode fingers 11a and 11b and the electrode fingers 21a and 21b, which are adjacent to or in a vicinity of each other in or substantially in the direction of propagation of elastic waves (x-axis direction), and includes a pair of comb-shaped electrodes 61L and 61R that are opposed to each other at a predetermined interval.

The comb-shaped electrode 61L is connected to the comb-shaped electrode 12a in the IDT electrode 10, and the comb-shaped electrode 61R is connected to the comb-shaped electrode 22a in the IDT electrode 20. More specifically, the comb-shaped electrode 61L is connected to the busbar electrode 10a in the comb-shaped electrode 12a, and the comb-shaped electrode 61R is connected to the electrode finger 21a that is closest to the IDT electrode 10 among the plurality of electrode fingers 21a in the comb-shaped electrode 22a.

The bridging capacitance 62 is arranged in a region other than the region sandwiched between the electrode fingers 11a and 11b and the electrode fingers 31a and 31b, which are adjacent to or in a vicinity of each other in or substantially in the direction of propagation of elastic waves (x-axis direction), and includes a pair of comb-shaped electrodes 62L and 62R that are opposed to each other at a predetermined interval.

The comb-shaped electrode 62R is connected to the comb-shaped electrode 12a in the IDT electrode 10, and the comb-shaped electrode 62L is connected to the comb-shaped electrode 32a in the IDT electrode 30. More specifically, the comb-shaped electrode 62R is connected to the busbar electrode 10a in the comb-shaped electrode 12a, and the comb-shaped electrode 62L is connected to the electrode finger 31a that is closest to the IDT electrode 10 among the plurality of electrode fingers 31a in the comb-shaped electrode 32a.

Figure 3:
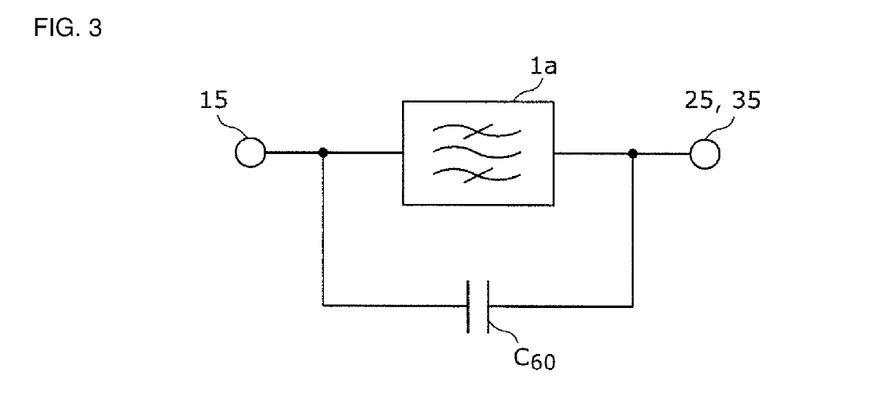
FIG. 3 is an equivalent circuit diagram of the surface acoustic wave filter according to the first preferred embodiment of the present invention.

FIG. 3 is an equivalent circuit diagram of the surface acoustic wave filter 1 according to the first preferred embodiment. As illustrated in FIG. 3, the surface acoustic wave filter 1 is able to be represented as an equivalent circuit in which a longitudinally coupled elastic wave filter portion 1a, including the IDT electrodes 10, 20, and 30 and reflectors 40 and 50, and a bridging capacitance portion $C_{60}$, including the bridging capacitances 61 and 62, are electrically connected in parallel with each other between the signal terminal 15 and the signal terminals 25 and 35.

Figure 4:
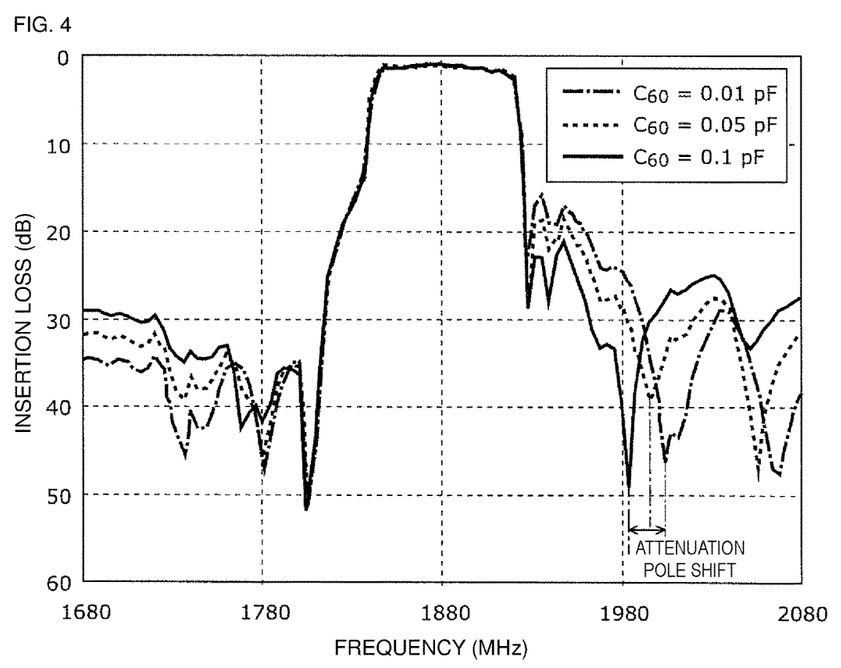
FIG. 4 is a graph that illustrates bandpass characteristics of the surface acoustic wave filter according to the first preferred embodiment of the present invention.

FIG. 4 is a graph that illustrates bandpass characteristics of the surface acoustic wave filter 1 according to the first preferred embodiment. The graph in FIG. 4 represents bandpass characteristics for high-frequency signals in the case where the signal terminal 15 is a high-frequency input terminal and the terminal electrically connected to the signal terminals 25 and 35 is a high-frequency output terminal.

As shown in FIG. 4, in the case where the capacitance value of the bridging capacitance portion $C_{60}$ is changed in the range from about 0.01 pF to about 0.1 pF, no changes are observed in the insertion loss within the pass band, but the attenuation pole shifts on a high-frequency side outside the pass band. Specifically, as the capacitance value of the bridging capacitance portion $C_{60}$ becomes larger from about 0.01 pF to about 0.1 pF, the above attenuation pole shifts toward the low-frequency side. According to this change in the characteristic, the attenuation characteristic on the high-frequency side outside the pass band is able to be significantly improved or optimized by changing the capacitance value of the bridging capacitance portion $C_{60}$.

In the above-described configuration, because the bridging capacitances 61 and 62 are arranged without changing the layout of the overlap region of the electrode fingers in the IDT electrodes 10 to 30 (included in the longitudinally coupled elastic wave filter portion 1a), which define the elastic-wave propagation characteristic, the out-of-band attenuation characteristic is able to be significantly improved without degrading the in-band bandpass characteristic of the surface acoustic wave filter 1. With the addition of the bridging capacitances 61 and 62, which include the comb-shaped electrodes, the area of all the electrodes is extended, and the thermal dissipation and pyroelectricity resistance (ESD resistance) are able to be significantly improved.

That is, the surface acoustic wave filter 1 according to the first preferred embodiment is able to improve the thermal dissipation and significantly improve or optimize the attenuation characteristic outside the pass band.

Because the bridging capacitances 61 and 62 are electrically connected between the input and output terminals for high-frequency signals, the attenuation pole on the out-of-band high-frequency side is able to be flexibly moved by adjusting the number of electrode fingers of the comb-shaped electrodes 61L, 61R, 62L, and 62R, the interval between the electrode fingers thereof, and the like. Accordingly, the capacitance value of the bridging capacitance portion $C_{60}$ is able to be adjusted and a significant improvement or optimization of the attenuation characteristic is able to be provided, without increasing the area of the layout of electrodes as compared with the case where the bridging capacitances include two linear electrodes.

A longitudinally coupled resonator surface acoustic wave filter of a comparative example includes filter characteristics in which it is difficult to ensure a sufficient attenuation on the out-of-band high-frequency side. In contrast, when the bridging capacitances 61 and 62 are arranged as in the surface acoustic wave filter 1 according to the first preferred embodiment, the attenuation pole on the out-of-band high-frequency side is able to be flexibly moved, which provides a significant improvement or optimization of the attenuation characteristic. Accordingly, the configuration according to the first preferred embodiment is suited, in particular, for a longitudinally coupled resonator surface acoustic wave filter.

The surface acoustic wave filter according to the first preferred embodiment may include only one of, or neither of, the above-described bridging capacitances 61 and 62, for example.

Figure 5:
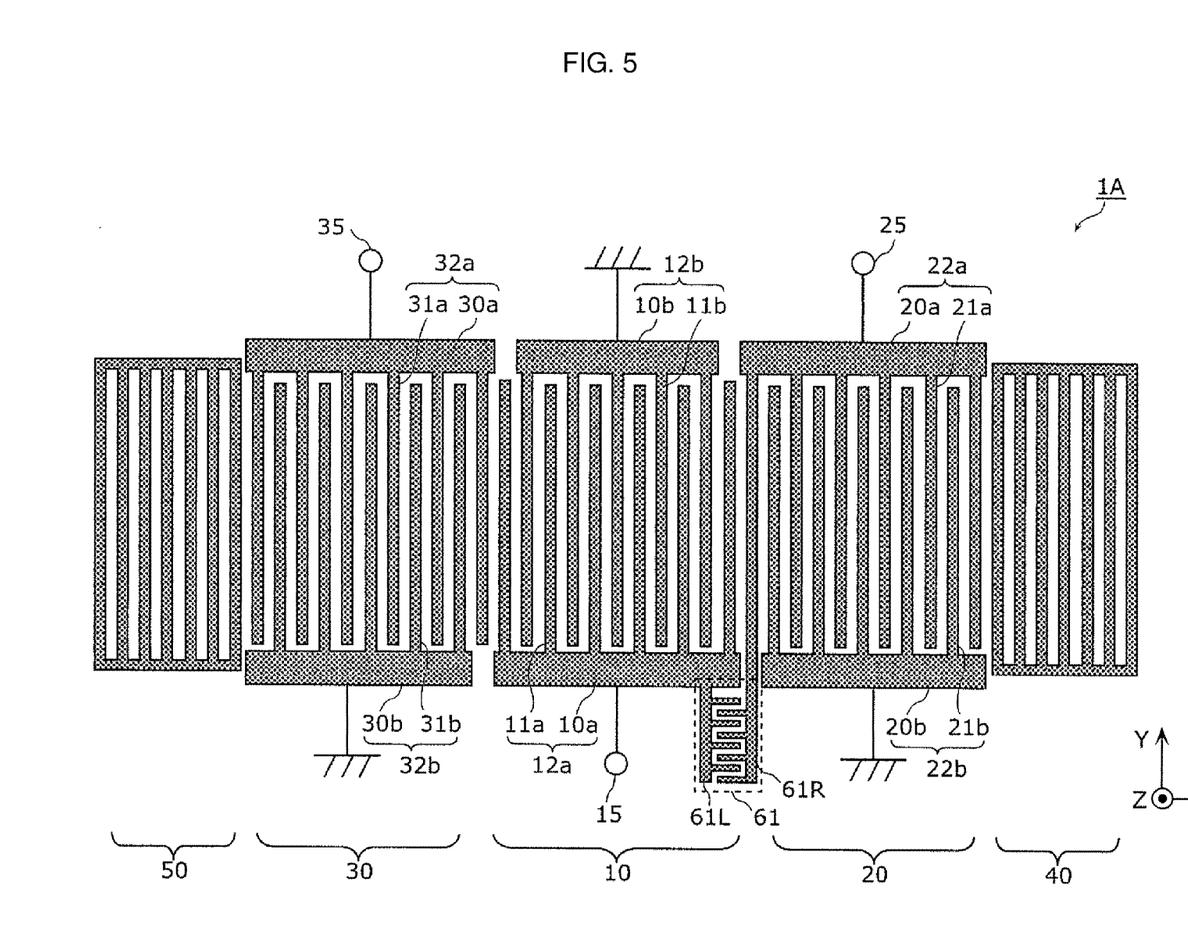
FIG. 5 is a plan view that illustrates an electrode configuration of a surface acoustic wave filter according to a variation of the first preferred embodiment of the present invention.

FIG. 5 is a plan view that illustrates an electrode configuration of a surface acoustic wave filter 1A according to a variation of the first preferred embodiment. As shown in FIG. 5, the surface acoustic wave filter 1A according to the present variation includes the IDT electrodes 10, 20, and 30 that are adjacent to or in a vicinity of each other in or substantially in the direction of propagation of elastic waves (x-axis direction); reflectors 40 and 50; signal terminals 15, 25, and 35; and bridging capacitance 61. The surface acoustic wave filter 1A according to the present variation differs from the surface acoustic wave filter 1 according to the first preferred embodiment only in that it does not include the bridging capacitance 62. That is, in the present variation, the bridging capacitance 61 is arranged between the adjacent or neighboring IDT electrodes 10 and 20, and the bridging capacitance 62 is not arranged between the adjacent or neighboring IDT electrodes 10 and 30.

The surface acoustic wave filter 1A according to the present variation is also able to improve the out-of-band attenuation characteristic without degrading the in-band bandpass characteristic, although the amount of shift of the attenuation pole on the high-frequency side outside the pass band is different from that of the surface acoustic wave filter 1 according to the first preferred embodiment. Accordingly, the surface acoustic wave filter 1A is able to improve the thermal dissipation and is also able to significantly improve or optimize the attenuation characteristic outside the pass band.

Second Preferred Embodiment

Figure 6:
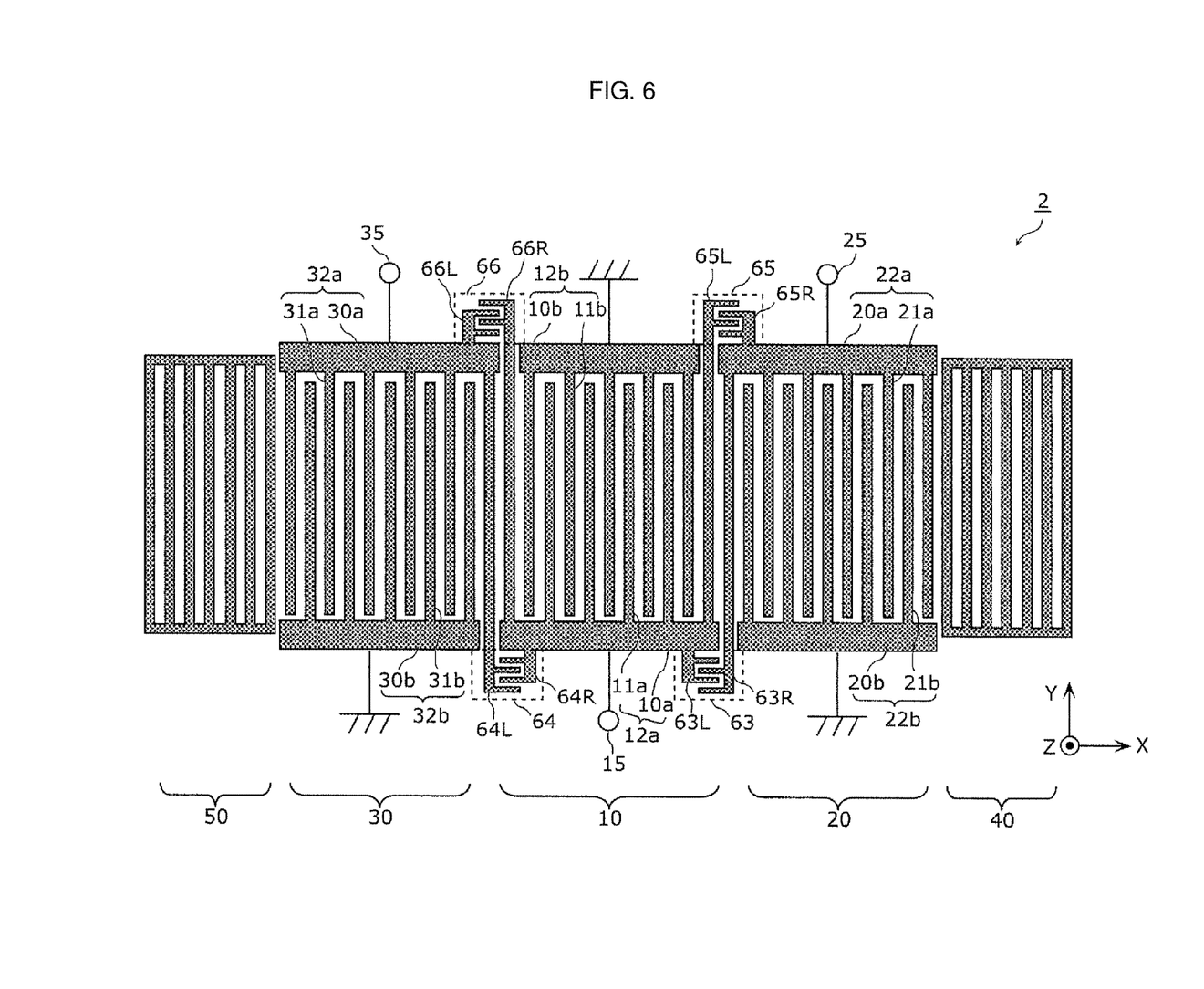
FIG. 6 is a plan view that illustrates an electrode configuration of a surface acoustic wave filter according to a second preferred embodiment of the present invention.

A surface acoustic wave filter 2 according to a second preferred embodiment of the present invention includes a structure in which each of the bridging capacitances 61 and 62 according to the first preferred embodiment is divided with the IDT electrodes disposed therebetween. The same or similar elements and components as in the surface acoustic wave filter 1 according to the first preferred embodiment are not described below, and the description below focuses on the elements and components that are different from the elements and components of the surface acoustic wave filter 1.

FIG. 6 is a plan view that illustrates an electrode configuration of the surface acoustic wave filter 2 according to the second preferred embodiment. FIG. 6 illustrates a layout of electrodes on a piezoelectric substrate when the piezoelectric substrate is seen in plan view. The surface acoustic wave filter 2 is a longitudinally coupled resonator elastic wave filter and may be included in, for example, a transmission filter or reception filter arranged in a front-end portion of a cellular phone.

As shown in FIG. 6, the surface acoustic wave filter 2 includes the IDT electrodes 10, 20, and 30 that are adjacent to or in a vicinity of each other in or substantially in the direction of propagation of elastic waves (x-axis direction), reflectors 40 and 50; signal terminals 15, 25, and 35; and bridging capacitances 63, 64, 65, and 66.

Next, the bridging capacitances 63 to 66 according to the second preferred embodiment are described below.

The bridging capacitance 63 is arranged in a region other than the region sandwiched between the electrode fingers 11a and 11b and the electrode fingers 21a and 21b, which are adjacent to or in a vicinity of each other in or substantially in the direction of propagation of elastic waves (x-axis direction), and includes a pair of comb-shaped electrodes 63L (first bridging capacitance) and 63R (second bridging capacitance) that are opposed to each other at a predetermined interval.

The comb-shaped electrode 63L is connected to the comb-shaped electrode 12a in the IDT electrode 10, and the comb-shaped electrode 63R is connected to the comb-shaped electrode 22a in the IDT electrode 20. More specifically, the comb-shaped electrode 63L is connected to the busbar electrode 10a in the comb-shaped electrode 12a, and the comb-shaped electrode 63R is connected to the electrode finger 21a that is closest to the IDT electrode 10 among the plurality of electrode fingers 21a in the comb-shaped electrode 22a.

The bridging capacitance 65 is arranged in a region other than the region sandwiched between the electrode fingers 11a and 11b and the electrode fingers 21a and 21b, which are adjacent to or in a vicinity of each other in or substantially in the direction of propagation of elastic waves (x-axis direction), and the bridging capacitance 65 is opposed to the bridging capacitance 63 with the IDT electrodes 10 and 20 disposed therebetween. The bridging capacitance 65 includes a pair of comb-shaped electrodes 65L and 65R that are opposed to each other at a predetermined interval.

The comb-shaped electrode 65L is connected to the comb-shaped electrode 12a in the IDT electrode 10, and the comb-shaped electrode 65R is connected to the comb-shaped electrode 22a in the IDT electrode 20. More specifically, the comb-shaped electrode 65L is connected to the electrode finger 11a that is closest to the IDT electrode 20 among the plurality of electrode fingers 11a in the comb-shaped electrode 12a, and the comb-shaped electrode 65R is connected to the busbar electrode 20a in the comb-shaped electrode 22a.

The bridging capacitance 64 is arranged in a region other than the region sandwiched between the electrode fingers 11a and 11b and the electrode fingers 31a and 31b, which are adjacent to or in a vicinity of each other in or substantially in the direction of propagation of elastic waves (x-axis direction), and includes a pair of comb-shaped electrodes 64L and 64R that are opposed to each other at a predetermined interval.

The comb-shaped electrode 64R is connected to the comb-shaped electrode 12a in the IDT electrode 10, and the comb-shaped electrode 64L is connected to the comb-shaped electrode 32a in the IDT electrode 30. More specifically, the comb-shaped electrode 64R is connected to the busbar electrode 10a in the comb-shaped electrode 12a, and the comb-shaped electrode 64L is connected to the electrode finger 31a that is closest to the IDT electrode 10 among the plurality of electrode fingers 31a in the comb-shaped electrode 32a.

The bridging capacitance 66 is arranged in a region other than the region sandwiched between the electrode fingers 11a and 11b and the electrode fingers 31a and 31b, which are adjacent to or in a vicinity of each other in or substantially in the direction of propagation of elastic waves (x-axis direction), and the bridging capacitance 66 is opposed to the bridging capacitance 64 with the IDT electrodes 10 and 30 disposed therebetween. The bridging capacitance 66 includes a pair of comb-shaped electrodes 66L and 66R that are opposed to each other at a predetermined interval.

The comb-shaped electrode 66R is connected to the comb-shaped electrode 12a in the IDT electrode 10, and the comb-shaped electrode 66L is connected to the comb-shaped electrode 32a in the IDT electrode 30. More specifically, the comb-shaped electrode 66R is connected to the electrode finger 11a that is closest to the IDT electrode 30 among the plurality of electrode fingers 11a in the comb-shaped electrode 12a, and the comb-shaped electrode 66L is connected to the busbar electrode 30a in the comb-shaped electrode 32a.

With the above-described configuration of the second preferred embodiment, similar to the equivalent circuit shown in FIG. 3, the surface acoustic wave filter 2 is able to be represented as an equivalent circuit in which the longitudinally coupled elastic wave filter portion 1a, including the IDT electrodes 10, 20, and 30 and reflectors 40 and 50, and a bridging capacitance portion $C_{60}$, including the bridging capacitances 63 to 66, are electrically connected in parallel with each other between the signal terminal 15 and the signal terminals 25 and 35. The bridging capacitance 61 in the first preferred embodiment is divided into the two bridging capacitances 63 and 65 in the second preferred embodiment, and the bridging capacitances 63 and 65 are electrically connected in parallel with each other between the IDT electrode 10 and IDT electrode 20. The two bridging capacitances 63 and 65 provide a capacitance value that is the same as or similar to a capacitive value of the bridging capacitance 61 and provide a resistive component lower than that of the bridging capacitance 61. That is, the division of the bridging capacitance 61 into two portions with the IDT electrodes 10 and 20 disposed therebetween provides an increase in conductance while maintaining the capacitance value of the bridging capacitance 61. The bridging capacitance 62 is divided into the two bridging capacitances 64 and 66 in the second preferred embodiment, and the bridging capacitances 64 and 66 are electrically connected in parallel with each other between the IDT electrode 10 and IDT electrode 30. The two bridging capacitances 64 and 66 provide a capacitance value that is the same as or similar to a capacitive value of the bridging capacitance 62 and provide a resistive component lower than that of the bridging capacitance 62. That is, the division of the bridging capacitance 62 into two portions with the IDT electrodes 10 and 30 disposed therebetween provides an increase in conductance while maintaining the capacitance value of the bridging capacitance 62.

Figure 7:
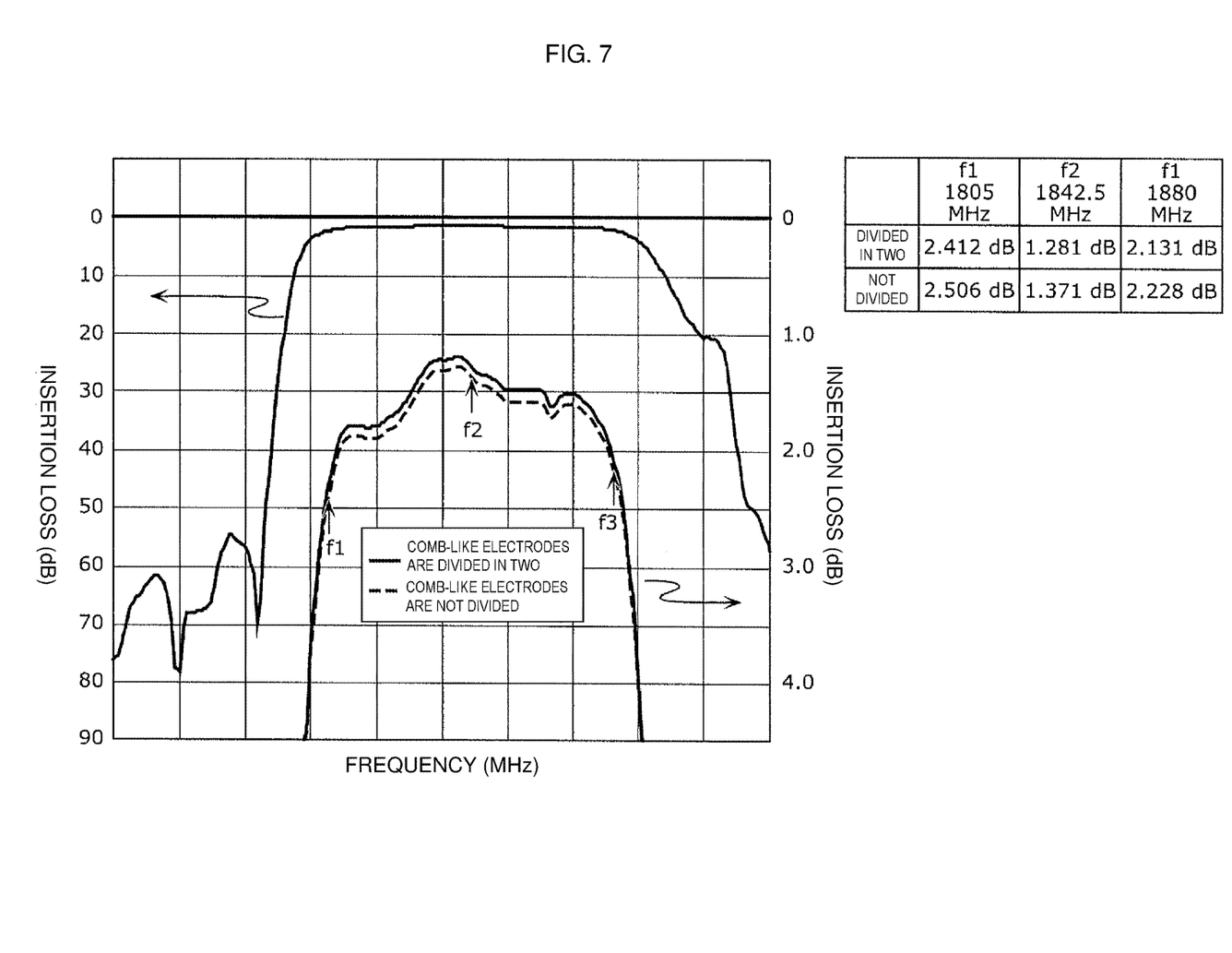
FIG. 7 is a graph that illustrates a comparison between a bandpass characteristic of the surface acoustic wave filter according to the first preferred embodiment and a bandpass characteristic of the surface acoustic wave filter according to the second preferred embodiment of the present invention.

FIG. 7 is a graph that illustrates comparison between a bandpass characteristic of the surface acoustic wave filter 1 according to the first preferred embodiment and a bandpass characteristic of the surface acoustic wave filter 2 according to the second preferred embodiment. The graph in FIG. 7 represents a bandpass characteristic for high-frequency signals in each of the surface acoustic wave filters 1 and 2 in the case where the signal terminal 15 is a high-frequency input terminal and the terminal electrically connected to the signal terminals 25 and 35 is a high-frequency output terminal.

As illustrates in FIG. 7, the surface acoustic wave filter 2, which includes the configuration in which each of the bridging capacitances 61 and 62 is divided into two portions, provides a significant reduction in insertion loss in the entire range within the pass band (low frequency range: about 1805 MHz, central frequency range: about 1842.5 MHz, high frequency range: about 1880 MHz). Furthermore, no significant differences between the surface acoustic wave filter 1 and surface acoustic wave filter 2 in the attenuation characteristic are present outside the pass band.

Due to the electrode arrangement configuration shown in FIG. 6 and the bandpass characteristic shown in FIG. 7, the surface acoustic wave filter 2 according to the second preferred embodiment is able to further improve the conductance component (i.e., reduce the resistive component) between the input and output terminals while maintaining the capacitance component, in comparison with the surface acoustic wave filter 1 according to the first preferred embodiment, in which one bridging capacitance is disposed between the adjacent or neighboring IDT electrodes. Accordingly, the Q value of the resonators including the IDT electrodes is able to be significantly improved, and the insertion loss within the pass band is able to be significantly reduced.

With respect to the surface acoustic wave filter including the IDT electrodes, the conductance during propagation of high-frequency signals has a nonlinear frequency dependence. Thus, for example, a peak of low conductance may appear at some frequency or frequencies of a high-frequency signal. In contrast, in the first and second preferred embodiments, by adjusting the number of electrode fingers in the comb-shaped electrode in the bridging capacitance and/or the intervals between the electrode fingers and the like, the propagation characteristic for high-frequency signals within the pass band is able to significantly improved by significantly reducing or preventing adverse effects of a low conductance region(s). That is, the propagation characteristic within the pass band is able to be significantly improved or optimized.

The two bridging capacitances 63 and 65 arranged between the adjacent or neighboring IDT electrodes 10 and 20 are opposed to each other with the IDT electrodes 10 and 20 disposed therebetween, and the two bridging capacitances 64 and 66 arranged between the IDT electrodes 10 and 30 are opposed to each other with the IDT electrodes 10 and 30 disposed therebetween. That is, the surface acoustic wave filter 2, in which the bridging capacitances with divided capacitance values are arranged on both sides of the IDT electrodes, is able to increase the efficiency of the electrode arrangement layout and is able to further significantly reduce the area of the electrodes, in comparison with the surface acoustic wave filter 1, in which one bridging capacitance with a large capacitance value is arranged on one side of the IDT electrodes.

In the above-described configuration of the second preferred embodiment, because the bridging capacitances 63 to 66 are arranged without changing the layout of the overlap region of the electrode fingers in the IDT electrodes 10 to 30 (included in the longitudinally coupled elastic wave filter portion 1a), which define the elastic-wave propagation characteristic, the out-of-band attenuation characteristic is able to be significantly improved. With the addition of the bridging capacitances 63 to 66, which include the comb-shaped electrodes, the area of all the electrodes is extended, and the thermal dissipation and pyroelectricity resistance (ESD resistance) are able to be significantly improved. Furthermore, the surface acoustic wave filter 2 is able to further improve the conductance component (i.e., reduce the resistive component) between the input and output terminals while maintaining the capacitance component, in comparison with the surface acoustic wave filter 1, in which one bridging capacitance is arranged between the adjacent or neighboring IDT electrodes. Accordingly, the Q value of the resonators including the IDT electrodes is able to be significantly improved, and the insertion loss within the pass band is able to be significantly reduced.

That is, the surface acoustic wave filter 2 according to the second preferred embodiment is able to improve the thermal dissipation and significantly improve or optimize the attenuation characteristic outside the pass band, and it is able to also significantly reduce the insertion loss within the pass band.

The surface acoustic wave filter according to the second preferred embodiment may include only one of, or neither of, the combination of bridging capacitances 63 and 65 and the combination of bridging capacitances 64 and 66 described above, for example.

Figure 8:
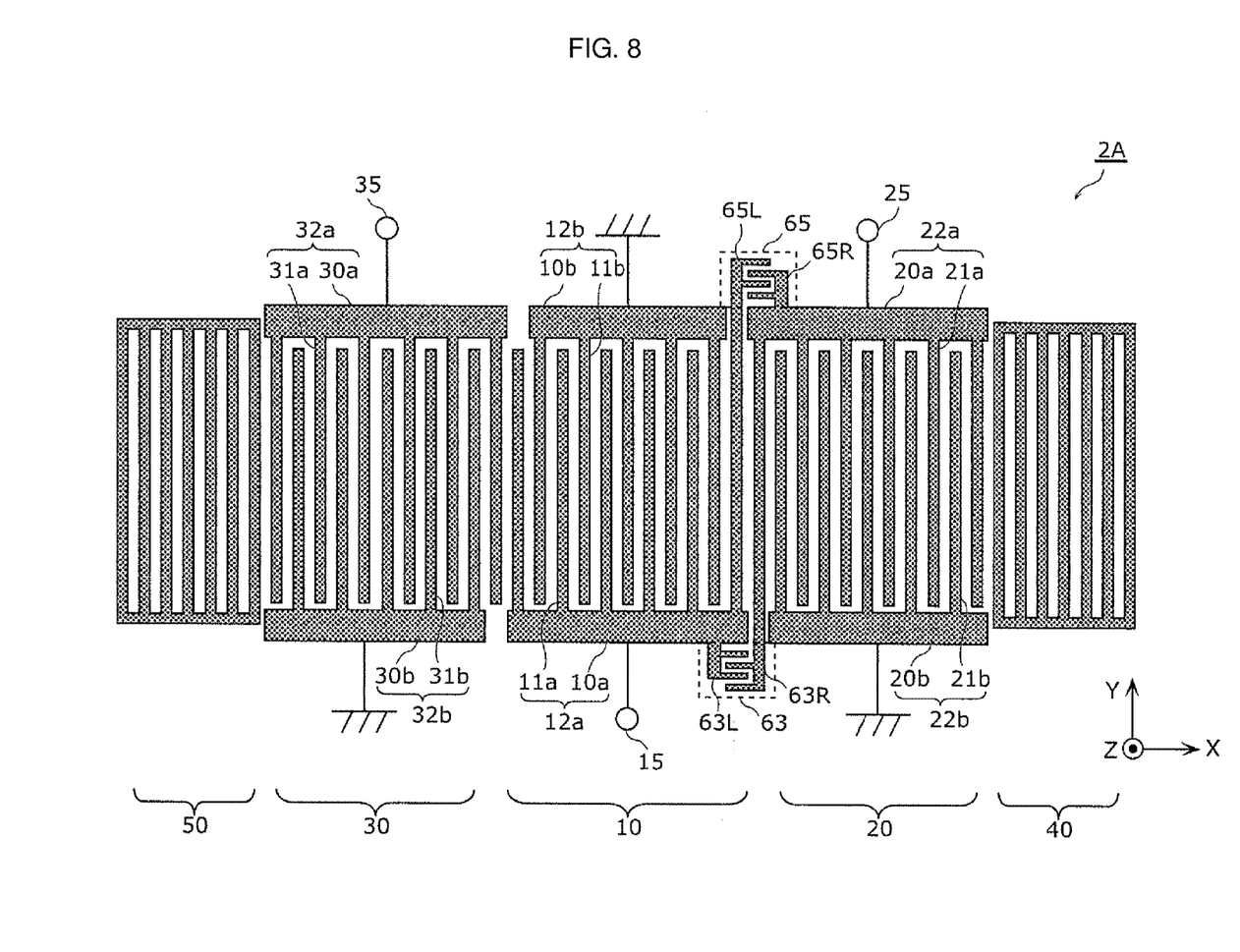
FIG. 8 is a plan view that illustrates an electrode configuration of a surface acoustic wave filter according to a variation of the second preferred embodiment of the present invention.

FIG. 8 is a plan view that illustrates an electrode configuration of a surface acoustic wave filter 2A according to a variation of the second preferred embodiment. As shown in FIG. 8, the surface acoustic wave filter 2A according to the present variation includes the IDT electrodes 10, 20, and 30 that are adjacent to or in a vicinity of each other in or substantially in the direction of propagation of elastic waves (x-axis direction); reflectors 40 and 50; signal terminals 15, 25, and 35; and bridging capacitances 63 and 65. The surface acoustic wave filter 2A according to the present variation differs from the surface acoustic wave filter 2 according to the second preferred embodiment only in that it includes neither the bridging capacitance 64 nor bridging capacitance 66. That is, in the present variation, the bridging capacitances 63 and 65 are arranged between the adjacent or neighboring IDT electrodes 10 and 20, and the bridging capacitances 64 and 66 are not arranged between the adjacent or neighboring IDT electrodes 10 and 30.

The surface acoustic wave filter 2A according to the present variation is also able to significantly improve the out-of-band attenuation characteristic and the in-band bandpass characteristic, although the amount of shift of the attenuation pole on the high-frequency side outside the pass band and the amount of reduction in the insertion loss within the pass band are different from those of the surface acoustic wave filter 2 according to the second preferred embodiment. Accordingly, the surface acoustic wave filter 2A is able to improve the thermal dissipation, significantly improve or optimize the attenuation characteristic outside the pass band, and significantly reduce the insertion loss within the pass band.

Other Preferred Embodiments

Elastic wave devices according to the present invention are described above with respect to the first and second preferred embodiments and variations thereof. However, elastic wave devices according to the present invention is not limited to the above-described preferred embodiments and variations. The present invention embraces other preferred embodiments provided by combination of any components in the above-described preferred embodiments and variations, variations provided by making various modifications conceivable by those skilled in the art to the above-described preferred embodiments and variations without departing from the scope of the present invention, and various apparatuses incorporating the elastic wave device according to preferred embodiments of the present invention.

For example, the direction in which one pair of comb-shaped electrodes included in the bridging capacitance are opposed is able to be determined in accordance with the electrode arrangement layout. For example, the direction may be a direction perpendicular or substantially perpendicular to the direction in which one pair of comb-shaped electrodes included in the IDT electrodes, as in the first and second preferred embodiments, and may also be the same or substantially the same direction.

In the first and second preferred embodiments and the variations thereof, the bridging capacitance is electrically connected between the comb-shaped electrode electrically connected to the high-frequency input terminal and the comb-shaped electrode electrically connected to the high-frequency output terminal. One of the comb-shaped electrodes electrically connected to the bridging capacitance may be electrically connected to the ground, for example.

Elastic wave devices according to preferred embodiments of the present invention are not limited to the longitudinally coupled resonator surface acoustic wave filter and may be, for example, a ladder-type surface acoustic wave filter. The elastic wave device may also be, for example, an elastic wave filter that includes series resonators and parallel resonators and that uses boundary acoustic waves or bulk acoustic waves (BAW).

The piezoelectric substrate 100 included in the surface acoustic wave filter may include, for example, a multilayer structure in which a high acoustic velocity support substrate, a low acoustic velocity film, and a piezoelectric film are laminated in this order. The piezoelectric film may include, for example, lithium tantalate (LiTaO$_3$) piezoelectric single crystal or piezoelectric ceramics. For example, the piezoelectric film may have a thickness of about 600 nm. The high acoustic velocity support substrate is a substrate that supports the low acoustic velocity film, piezoelectric film, and IDT electrodes. The high acoustic velocity support substrate is a substrate in which the acoustic velocity of bulk waves therein is higher than that of elastic waves, for example, surface waves or boundary waves, propagating in the piezoelectric film and functions to confine or substantially confine surface acoustic waves in the portion in which the piezoelectric film and low acoustic velocity film are laminated and to significantly reduce or prevent the surface acoustic waves from leaking to below the high acoustic velocity support substrate. One example of the high acoustic velocity support substrate is a silicon substrate, and the high acoustic velocity support substrate may include, for example, a thickness of about 200 μm. The low acoustic velocity film is a film in which the acoustic velocity of bulk waves therein is lower than that of bulk waves propagating in the piezoelectric film and is arranged between the piezoelectric film and high acoustic velocity support substrate. Because of this structure and the tendency of the energy of elastic waves to concentrate on a low acoustic velocity medium, the leakage of the energy of surface acoustic waves to outside the IDT electrodes is able to be significantly reduced or prevented. One example of the low acoustic velocity film is a film that includes silicon dioxide as a primary component and may include, for example, a thickness of about 670 nm. This multilayer structure is able to significantly increase the Q values at the resonant frequency and at the anti-resonant frequency, in comparison with the structure in which a single layer is included as the piezoelectric substrate 100. That is, a surface acoustic wave resonator with a high Q value is able to be provided, and the application of this surface acoustic wave resonator in a filter is able to provide the filter with a low insertion loss.

The high acoustic velocity support substrate may include, for example, a structure in which a support substrate and a high acoustic velocity film where the acoustic velocity of bulk waves propagating therein is higher than the acoustic velocity of elastic waves propagating therein, for example, surface waves or boundary waves, propagating in the piezoelectric film are laminated. In this case, a piezoelectric material (for example, sapphire, lithium tantalate, lithium niobate, or quartz), a dielectric material (for example, a glass or a ceramic, e.g., aluminum oxide, magnesium oxide, silicon nitride, aluminum nitride, silicon carbide, zirconium oxide, cordierite, mullite, steatite, or forsterite), or a semiconductor material (for example, silicon or gallium nitride), and a resin substrate may be included in the support substrate, for example. Various high acoustic velocity materials (for example, aluminum nitride, aluminum oxide, silicon carbide, silicon nitride, silicon oxynitride, diamond-like carbon (DLC) film, or diamond), a medium including any of the above-described materials as a primary component, or a medium predominantly composed of a mixture of any of the above-described materials, may be included in the high acoustic velocity film, for example.

Preferred embodiments of the present invention are able to be applied as transmission and reception filters and a multiplexer included in a front end of a wireless communication terminal to provide the wireless communication terminal with a low insertion loss within the pass band and a high attenuation outside the pass band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
  a first signal terminal;
  a second signal terminal;
  a first interdigital transducer (IDT) electrode and a second IDT electrode that are adjacent to or in a vicinity of each other in or substantially in a direction of propagation of elastic waves; and
  at least one bridging capacitance; wherein
  each of the first IDT electrode and the second IDT electrode includes a pair of comb-shaped electrodes, each of the comb-shaped electrodes including a busbar electrode extending in or substantially in the direction of propagation of elastic waves and a plurality of electrode fingers connected to the busbar electrode and extending in or substantially in a direction that crosses the direction of propagation of elastic waves;
  one of the pair of comb-shaped electrodes in the first IDT electrode is a first comb-shaped electrode directly electrically connected to the first signal terminal, and one of the pair of comb-shaped electrodes in the second IDT electrode is a second comb-shaped electrode electrically connected to the second signal terminal;
  the bridging capacitance is arranged in a region outside a region sandwiched between the electrode fingers that are adjacent to or in a vicinity of each other in or substantially in the direction of propagation of elastic waves and includes a pair of comb-shaped electrodes opposed to each other at a predetermined interval; and
  a first one of the pair of comb-shaped electrodes in the bridging capacitance is a first comb-shaped electrode directly electrically connected to the first comb-shaped electrode of the first IDT electrode, and a second one of the pair of comb-shaped electrodes is a second comb-shaped electrode electrically connected to either one of the pair of comb-shaped electrodes in the second IDT electrode.

2. The elastic wave device according to claim 1, wherein the first comb-shaped electrode in the bridging capacitance is electrically connected to the busbar electrode in the first comb-shaped electrode; and
  the second comb-shaped electrode in the bridging capacitance is electrically connected to the electrode finger that is closest to the first IDT electrode among the plurality of electrode fingers in the second comb-shaped electrode.

3. The elastic wave device according to claim 1, wherein the elastic wave device is a longitudinally coupled resonator surface acoustic wave filter.

4. The elastic wave device according to claim 1, wherein the at least one bridging capacitance comprises a plurality of bridging capacitances.

5. The elastic wave device according to claim 4, wherein the plurality of bridging capacitances include a first bridging capacitance and a second bridging capacitance that are opposed to each other with the first IDT electrode and the second IDT electrode disposed therebetween;
  a first one of the pair of comb-shaped electrodes in the first bridging capacitance is electrically connected to the busbar electrode in the first comb-shaped electrode;
  a second one of the pair of comb-shaped electrodes in the first bridging capacitance is electrically connected to the electrode finger that is closest to the first IDT electrode among the plurality of electrode fingers in the second comb-shaped electrode;
  a first one of the pair of comb-shaped electrodes in the second bridging capacitance is electrically connected to the busbar electrode in the second comb-shaped electrode; and
  a second one of the pair of comb-shaped electrodes in the second bridging capacitance is electrically connected to the electrode finger that is closest to the second IDT electrode among the plurality of electrode fingers in the first comb-shaped electrode.

6. The elastic wave device according to claim 1, wherein the first signal terminal is a high-frequency input terminal and the second signal terminal is a high-frequency output terminal.

7. The elastic wave device according to claim 1, wherein the first signal terminal is a high-frequency output terminal and the second signal terminal is a high-frequency input terminal.

8. The elastic wave device according to claim 1, further comprising:
a third signal terminal; and
a third IDT electrode; wherein
the third IDT electrode includes a pair of comb-shaped electrodes;
one of the pair of comb-shaped electrodes in the third IDT electrode is electrically connected to the first signal terminal.

9. The elastic wave device according to claim 1, wherein the elastic wave device defines and functions as an unbalanced-input, unbalanced-output filter.

10. The elastic wave device according to claim 9, wherein the filter attenuates signals that are higher than a predetermined frequency.

11. A resonator, comprising:
the elastic wave device according to claim 1; and
a piezoelectric substrate; wherein
the first comb-shaped electrode and the second comb-shaped electrode are disposed on the piezoelectric substrate.

12. The resonator according to claim 11, wherein the plurality of electrode fingers of each of the first comb-shaped electrode and the second comb-shaped electrode extend in parallel or substantially in parallel with each other.

13. The resonator according to claim 11, wherein
the first IDT electrode includes a multilayer structure including a close contact layer and a main electrode layer; and
the close contact layer adheres the main electrode layer to the piezoelectric substrate.

14. The resonator according to claim 11, wherein the first IDT electrode is covered with a protective layer.

15. The resonator according to claim 11, wherein the piezoelectric substrate includes a multilayer structure including a high acoustic velocity support substrate, a low acoustic velocity film, and a piezoelectric film.

16. The resonator according to claim 15, wherein
the high acoustic velocity support substrate includes a support substrate and a high acoustic velocity film; and
in the high acoustic velocity film, an acoustic velocity of bulk waves propagating therein is higher than an acoustic velocity of elastic waves propagating therein.

17. The resonator according to claim 11, wherein
the first comb-shaped electrode in the bridging capacitance is electrically connected to the bulbar electrode in the first comb-shaped electrode; and
the second comb-shaped electrode in the bridging capacitance is electrically connected to the electrode finger that is closest to the first IDT electrode among the plurality of electrode fingers in the second comb-shaped electrode.

18. The resonator according to claim 11, wherein the elastic wave device is a longitudinally coupled resonator surface acoustic wave filter.

19. The resonator according to claim 11, wherein the at least one bridging capacitance comprises a plurality of bridging capacitances.

20. The resonator according to claim 19, wherein
the plurality of bridging capacitances include a first bridging capacitance and a second bridging capacitance that are opposed to each other with the first IDT electrode and the second IDT electrode disposed therebetween;
a first one of the pair of comb-shaped electrodes in the first bridging capacitance is electrically connected to the busbar electrode in the first comb-shaped electrode;
a second one of the pair of comb-shaped electrodes in the first bridging capacitance is electrically connected to the electrode finger that is closest to the first IDT electrode among the plurality of electrode fingers in the second comb-shaped electrode;
a first one of the pair of comb-shaped electrodes in the second bridging capacitance is electrically connected to the busbar electrode in the second comb-shaped electrode; and
a second one of the pair of comb-shaped electrodes in the second bridging capacitance is electrically connected to the electrode finger that is closest to the second IDT electrode among the plurality of electrode fingers in the first comb-shaped electrode.

* * * * *